United States Patent
Suh et al.

(10) Patent No.: US 8,729,792 B2
(45) Date of Patent: May 20, 2014

(54) SIGN BOARD

(75) Inventors: Min-Chul Suh, Suwon-si (KR); Hye-Dong Kim, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 656 days.

(21) Appl. No.: 12/318,698

(22) Filed: Jan. 6, 2009

(65) Prior Publication Data

US 2009/0267493 A1    Oct. 29, 2009

(30) Foreign Application Priority Data

Apr. 24, 2008 (KR) .................. 10-2008-0038253

(51) Int. Cl.
*G09F 13/22* (2006.01)
*H01J 1/62* (2006.01)
*H01J 63/04* (2006.01)

(52) U.S. Cl.
USPC ............................................ 313/504; 40/544

(58) Field of Classification Search
USPC ................... 313/498–512; 257/59; 40/544
See application file for complete search history.

(56) References Cited

U.S. PATENT DOCUMENTS

| | | | |
|---|---|---|---|
| 6,034,481 A * | 3/2000 | Haynes ................. | 315/169.3 |
| 2003/0098828 A1* | 5/2003 | Hunter et al. ................. | 345/76 |
| 2005/0104508 A1* | 5/2005 | Ozawa et al. ................. | 313/500 |
| 2006/0027806 A1* | 2/2006 | Koo et al. ................. | 257/59 |

FOREIGN PATENT DOCUMENTS

| | | |
|---|---|---|
| KR | 1020000062303 | 10/2000 |
| KR | 1020010104289 | 11/2001 |
| KR | 1020060075490 A | 7/2006 |
| KR | 100765079 B1 | 10/2007 |

OTHER PUBLICATIONS

Transmitter letter and Koran Office Action issued by the Korean Patent Office on Jun. 25, 2009 in the corresponding Korean Patent Application No. 10-2008-0038253.
Registration Determination Certificate from the Korean Intellectual Property Office issued in Applicant's Korean Patent Application No. 10-2008-0038253 dated Nov. 30, 2009.

* cited by examiner

*Primary Examiner* — Anh Mai
*Assistant Examiner* — Zachary J Snyder
(74) *Attorney, Agent, or Firm* — Robert E. Bushnell, Esq.

(57) ABSTRACT

Provided is a high-quality sign board including an organic light emitting device (OLED) which can be easily adapted to various designs applied by users to the sign board. The sign board includes a substrate, a plurality of first conductive lines disposed on the substrate, a plurality of pixel electrodes electrically connected with the first conductive lines, an intermediate layer comprising a light emitting layer disposed on the pixel electrodes, and a face electrode disposed on the intermediate layer. In another embodiment, the sign board further includes a plurality of second conductive lines, each of which connects at least two of the first conductive lines to each other. In still another embodiment, the plurality of pixel electrodes includes a plurality of first pixel electrodes electrically connected with the first conductive lines, and a plurality of second pixel electrodes that are not electrically connected with the first conductive lines.

8 Claims, 5 Drawing Sheets

SIGN BOARD

CLAIM OF PRIORITY

This application makes reference to, incorporates the same herein, and claims all benefits accruing under 35 U.S.C. §119 from an application for SIGN BOARD earlier filed in the Korean Intellectual Property Office on the 24th of Apr. 2008 and there duly assigned Serial No. 10-2008-0038253.

BACKGROUND OF THE INVENTION

1. Field of the Invention

The present invention relates to a sign board, and more particularly, to a high-quality sign board using an organic light emitting device (OLED), which can be easily adapted to various designs applied by users to the sign board.

2. Description of the Related Art

In general, a sign board has a light emitting region for realizing a specific design. Such a conventional sign board generally has a penetration region having a specific design and a backlight disposed at the rear surface of the penetration region. Accordingly, while light from the backlight penetrates the penetration region disposed at the front surface of the backlight, an image with a specific design appears on the front surface.

However, in conventional sign boards, fluorescent lamps are generally used as the backlight and thus visibility thereof is not satisfactory. Accordingly, sign boards in which a plurality of light-emitting lamps is arranged in specific locations of the sign board have been developed, thereby realizing image with specific designs. However, the light-emitting lamps should be arranged in specific locations according to the specific designs in such a conventional sign board, and therefore mass production of such sign boards is difficult. These sigh boards can only be manually manufactured according to the design. In addition, the light-emitting lamps should be individually examined and installed before manufacturing the conventional sign board for realizing an image according to a specific design, thereby further complicating the manufacturing process.

SUMMARY OF THE INVENTION

The present invention provides a high-quality sign board which can easily reflect various designs applied by users thereto.

According to an aspect of the present invention, there is provided a sign board including an organic light emitting device (OLED). The sign board includes a substrate, a plurality of first conductive lines disposed on the substrate, a plurality of pixel electrodes electrically connected with the first conductive lines, an intermediate layer disposed on the pixel electrodes and including a light emitting layer for emitting light, and a face electrode disposed on the intermediate layer.

The sign board may further include an insulator to cover a part of the first conductive lines other than a part to which the pixel electrodes are electrically connected.

The sign board may further include a plurality of second conductive lines, each of which connects at least two of the first conductive lines to each other. One of the pixel electrodes may be disposed between two of the first conductive lines and between two of the second conductive lines.

The sign board may further an insulator to cover a part of the first conductive lines other than a part to which the pixel electrodes are electrically connected, and the second conductive lines.

The plurality of the first conductive lines may be electrically connected to each other.

According to another aspect of the present invention, there is provided a sign board including an organic light emitting device (OLED). The sign board includes a substrate, a plurality of first conductive lines disposed on the substrate, a plurality of pixel electrodes, an intermediate layer comprising a light emitting layer disposed on the pixel electrodes, and a face electrode disposed on the intermediate layer. The pixel electrodes includes a plurality of first pixel electrodes electrically connected with the first conductive lines, and a plurality of second pixel electrodes that are not electrically connected with the first conductive lines.

The sign board may further include an insulator to cover a part of the first conductive lines other than a part to which the pixel electrodes are electrically connected.

The sign board may further include a plurality of second conductive lines, each of which connects at least two of the first conductive lines to each other. One of the pixel electrodes may be disposed between two of the first conductive lines and between two of the second conductive lines.

The sign board may further include an insulator to cover a part of the first conductive lines other than a part, to which the pixel electrodes are electrically connected, and the second conductive lines.

The plurality of the first conductive lines may be electrically connected to each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Hereinafter, the present invention will be described more fully with reference to the accompanying drawings, in which exemplary embodiments of the invention are shown.

Figure 1:
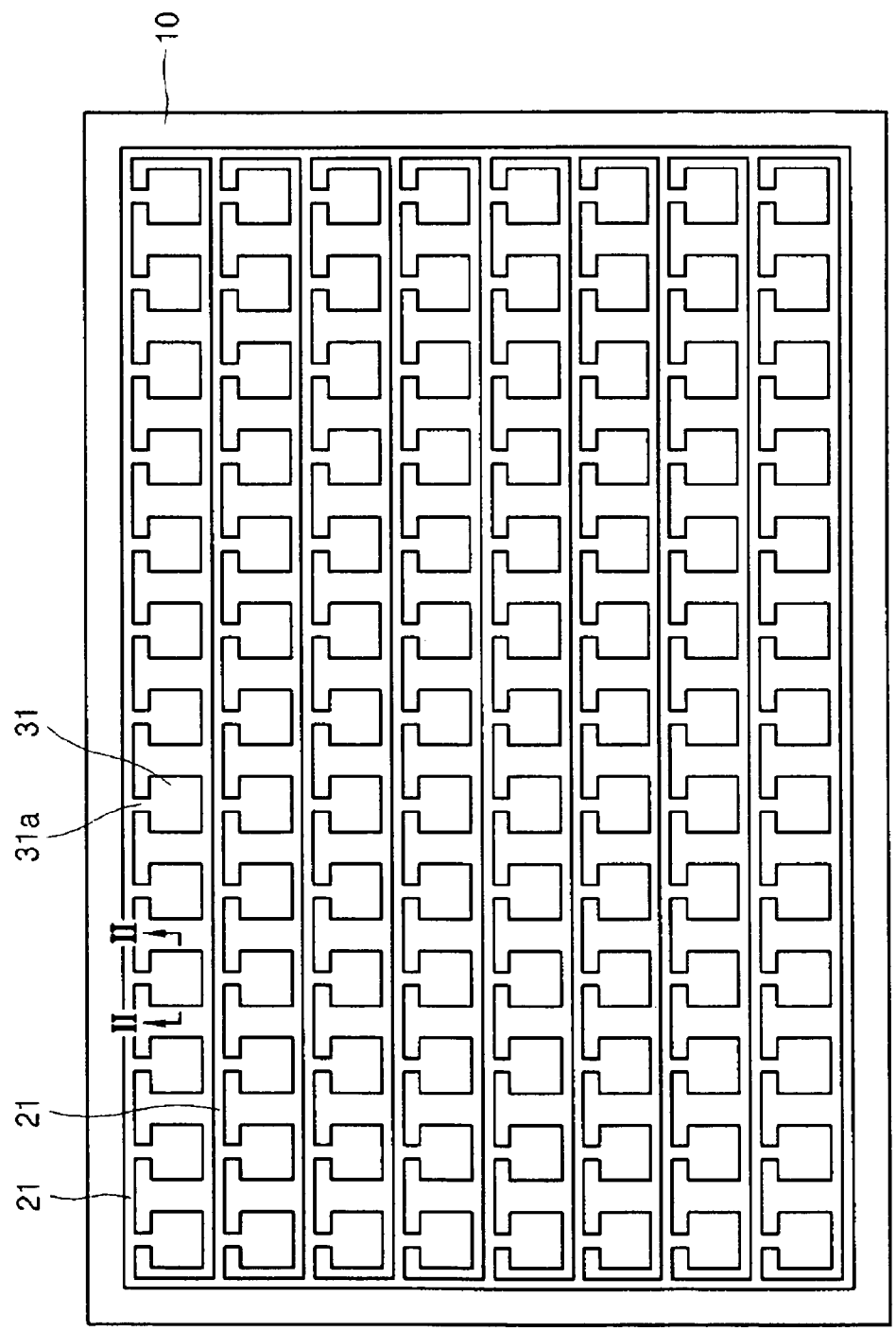
FIG. 1 is a plan view schematically illustrating a part of a sign board using an organic light emitting device (OLED), according to an embodiment of the present invention.
Figure 2:
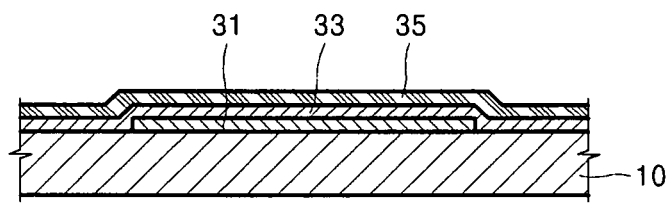
FIG. 2 is a cross-sectional view of the sign board of FIG. 1 taken along a line II-II of FIG. 1, including an element that is not illustrated in FIG. 1, according to an embodiment of the present invention.

FIG. 1 is a plan view schematically illustrating a part of a sign board using an organic light emitting device (OLED), according to an embodiment of the present invention and FIG. 2 is a cross-sectional view of the sign board of FIG. 1 taken along a line II-II of FIG. 1, including an element that is not illustrated in FIG. 1.

Referring to FIGS. 1 and 2, the sign board using an OLED according to the current embodiment of the present invention includes a substrate 10, a plurality of first conductive lines 21 disposed on the substrate 10, a plurality of pixel electrodes 31 electrically connected with the first conductive lines 21, an intermediate layer 33 disposed on the substrate and covering the pixel electrodes 31, and a face electrode 35 disposed on the intermediate layer 33. The intermediate layer 33 includes a light emitting layer that emits light.

The substrate 10 may be formed of glass, metal, or plastic. The first conductive lines 21 disposed on the substrate 10 may be formed of various conductive materials, for example, PEDOT, polyaniline (PANI), Au, Li, Ca, LiF/Ca, LiF/Al, Al, Ag, and Mg, and/or a single layer or a multi-layer structure formed of a compound of those materials. As illustrated in FIG. 1, the plurality of the first conductive lines 21 may be electrically connected to each other. Meanwhile, the sign board may further include an insulator (not shown) to cover a part of the first conductive lines 21 other than a part to which the pixel electrodes 31 are electrically connected.

The pixel electrodes 31 may be formed of PEDOT, polyaniline (PANI), Au, Li, Ca, LiF/Ca, LiF/Al, Al, Ag, and Mg, and/or a single layer or a multi-layer structure formed of a compound of those materials. If the sign board is a rear emitting type sign board in which light generated from the intermediate layer 33 is emitted to the outside through the substrate 10, the pixel electrodes 31 may be formed of transparent conductive materials such as ITO, IZO, ZnO, or $In_2O_3$. If the sign board is a front emitting type sign board in which light generated from the intermediate layer 33 is emitted to the outside through the face electrode 35, instead of the substrate 10, the pixel electrodes 31 may be formed of reflective materials. In addition, a reflective layer (not shown) may be separately interposed between the pixel electrodes 31 and the substrate 10. Each of the pixel electrodes 31 defines a region of one pixel (sub-pixel), and is electrically connected with the first conductive lines 21 through a connection unit 31a, as illustrated in FIG. 1. Also, the pixel electrodes 31 and the first conductive lines 21 may be integrally formed as a single body, if necessary.

The intermediate layer 33 is disposed on the substrate 10 covering the pixel electrodes 31. More specifically, a portion of the intermediate layer 33 is disposed on the pixel electrodes 31, and the remaining portion of the intermediate layer 33 is disposed on the substrate 10. Also, although not illustrated in FIG. 2, the intermediate layer 33 may be patterned into pixel forms. In this case, the intermediate layer 33 may be patterned to correspond to each of the pixel electrodes 31. When the intermediate layer 33 is patterned to correspond to each of the pixel electrodes 31, a pixel of the intermediate layer 33 may extend beyond each of the pixel electrodes 31, or may be disposed inside each of the pixel electrodes 31. However, the intermediate layer 33 is not limited to these structures. Since the intermediate layer 33 may include various layers, in addition to the light emitting layer, some of the layers may be patterned to correspond to each of the pixel electrodes 31 and other remaining layers may not be patterned. In addition, the patterned layers may be patterned to correspond to the plurality of the pixel electrodes 31, instead of each of the pixel electrodes 31. However, the patterned layers are not limited to these structures.

The intermediate layer 33 may be formed of low molecular weight materials or polymer materials. When low molecular weight materials are used, the intermediate layer 33 may be in the form of a single or multi-layer structure including at least one of a hole injection layer (HIL), a hole transport layer (HTL), an emission layer (EML), an electron transport layer (ETL), and an electron injection layer (EIL). Examples of the low molecular weight materials used to form the intermediate layer 33 include copper phthalocyanine (CuPc), N,N'-Di (naphthalene-1-yl)-N,N'-diphenyl-benzidine (NPB), and tris-8-hydroxyquinoline aluminum (Alq3). These layers may be formed using a vacuum deposition method. When polymer materials are used, the intermediate layer 33 may have a structure mainly formed of a HTL and an EML. Here, the HTL may be formed of PEDOT and the EML may be formed of polymer materials such as Poly-Phenylenevinylene (PPV) and Polyfluorene. These layers may be formed using a screen printing method or an inkjet printing method. However, the intermediate layer 33 is not limited thereto and may have various structures.

The face electrode 35 may include a layer formed of a metal having a low work function, that is, Li, Ca, LiF/Ca, LiF/Al, Al, Ag, and Mg and/or a compound thereof, and a layer formed of a transparent conductive material such as ITO, IZO, ZnO, or $In_2O_3$. The face electrode 35 may be a single layer or a multi-layer structure, and may be a reflective layer or a transparent layer.

In the sign board using an OLED according to the current embodiment of the present invention, the first conductive lines 21 and the pixel electrodes 31 are not necessarily all electrically connected with each other, and thus an image with a specific pattern can be realized. In other words, the sign board illustrated in FIGS. 1 and 2 is not limited to forming a single image with a specific design, can be mass produced, and can realize various images with specific designs in response to a number of requests by users. Referring to FIGS. 1 and 2, the sign board, which can be mass produced, is manufactured and then, users or manufacturers who receive requests from users to realize a specific design connect some of the first conductive lines 21 and the pixel electrodes 31 according to the design, thereby completing the manufacture of the sign board realizing the specific design.

Figure 3:
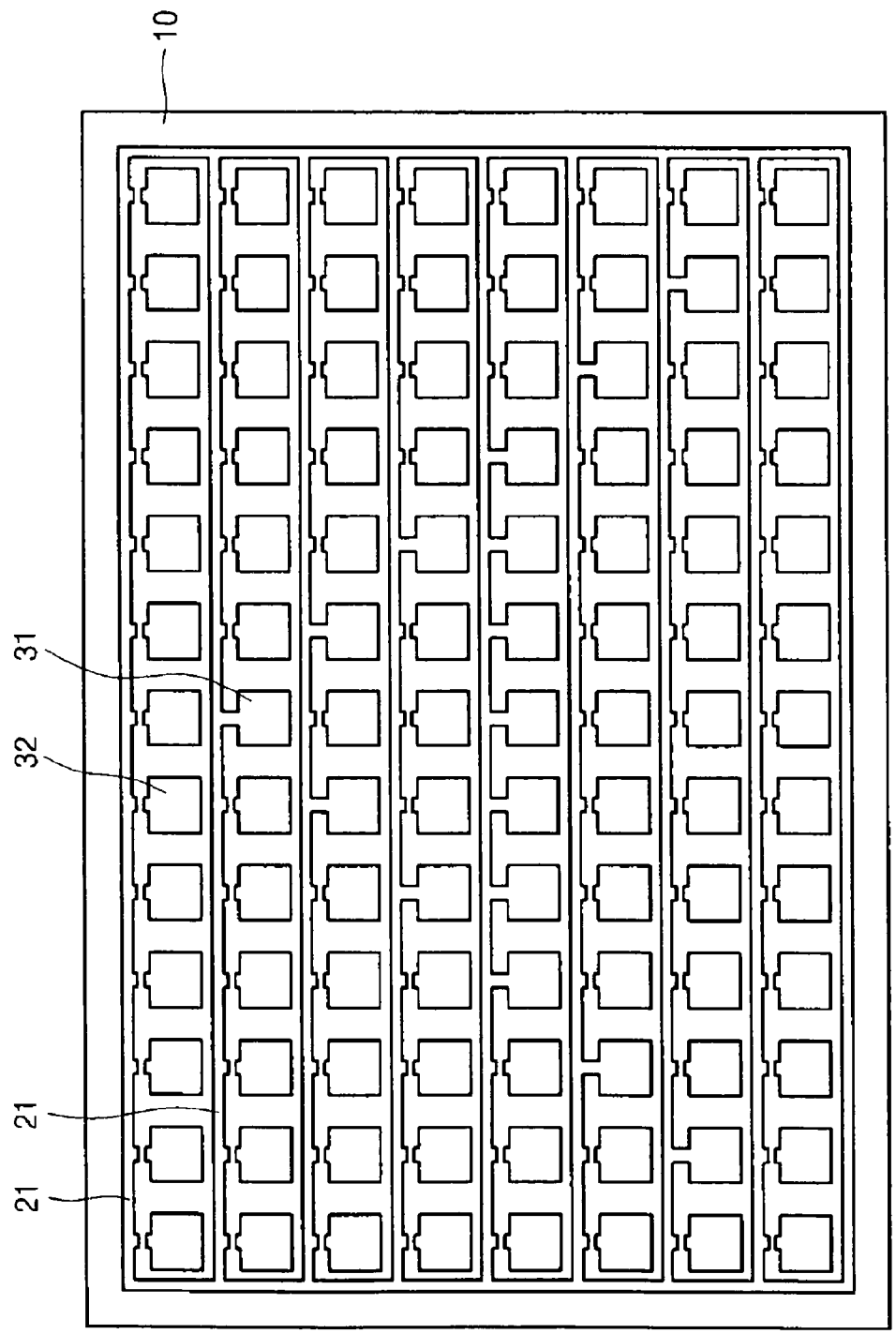
FIG. 3 is a plan view schematically illustrating a part of a sign board using an OLED, according to another embodiment of the present invention.

FIG. 3 is a plan view schematically illustrating a part of a sign board using an OLED, according to another embodiment of the present invention. Referring to FIG. 3, the sign board according to the current embodiment of the present invention includes a plurality of first conductive lines 21, a plurality of first pixel electrodes 31 electrically connected with the first conductive lines 21, a plurality of second pixel electrodes 32 that are not electrically connected with the first conductive lines 21, an intermediate layer (not shown) including a light emitting layer, and a face electrode (not shown) disposed on the intermediate layer. If necessary, the sign board may further include an insulator (not shown) to cover a part of the first conductive lines 21 other than a part to which the pixel electrodes 31 are electrically connected.

In other words, the sign board of FIG. 3 is manufactured such that some of the first conductive lines 21 and the pixel electrodes 31 are electrically connected with each other to realize an image with a specific pattern. In the case of the sign board of FIG. 3, the pixel electrodes 31 that are electrically connected with the first conductive lines 21 are arranged in an 'A' shape. In the sign board illustrated in FIG. 3, when an electrical signal is applied to the pixel electrodes 31 that are connected with the first conductive lines 21, an 'A' shaped specific image is realized. In addition, as illustrated in FIG. 3, the plurality of the first conductive lines 21 may be electrically connected with each other.

As described above, when the sign board using an OLED of FIGS. 1 and 2 is used, some of the pixel electrodes 31 are electrically connected with the first conductive lines 21, and some of the pixel electrodes 31 are not electrically connected with the first conductive lines 21, thereby completing the manufacture of a sign board with a specific design. Since OLEDs have excellent visibility, the sign board manufactured as above has excellent visibility, compared with that of a conventional sign board. In addition, since the sign board can be mass produced, the manufacturing process thereof is relatively simple, and some of the pixel electrodes 31 are not connected with the first conductive lines 21, thereby realizing a desired image with a specific pattern. When the sign board as illustrated in FIGS. 1 and 2 is manufactured and tested before realizing a specific patterned design, light emission from all regions of the sign board is performed, and thus defective pixels may be easily identified beforehand.

In order to complete the manufacture of the sign board illustrated in FIG. 3, which realizes an image with a specific pattern by using the sign board using an OLED of FIGS. 1 and 2 and connecting some of the pixel electrodes 31 to the corresponding first conductive lines 21, laser ablation technology (LAT), for example, may be used. In other words, a laser beam may be irradiated to the connection unit 31a connecting the first conductive lines 21 and the pixel electrodes 31 so that the part of the connection unit 31a is cut, thereby easily completing the manufacture of the sign board realizing an image with a specific pattern illustrated in FIG. 3.

Figure 4:
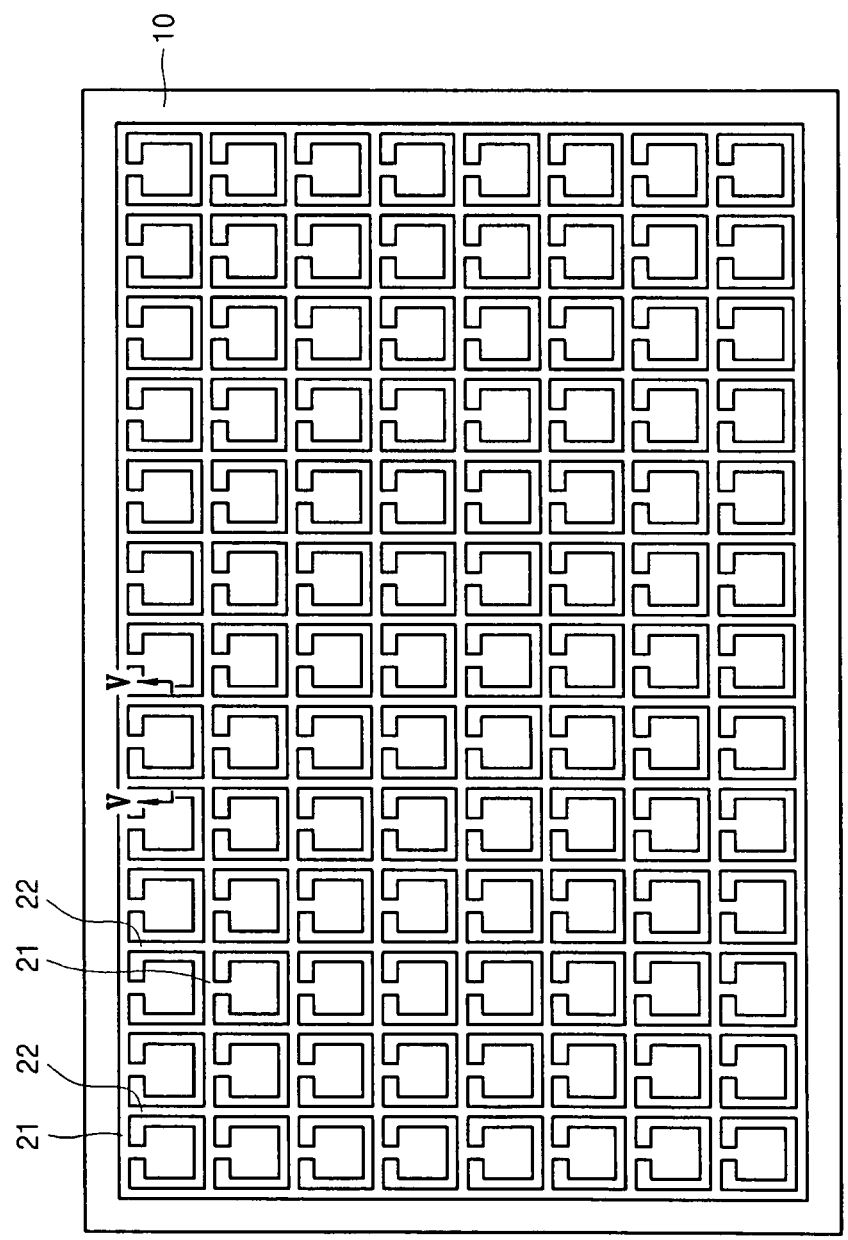
FIG. 4 is a plan view schematically illustrating a part of a sign board using an OLED, according to another embodiment of the present invention.
Figure 5:
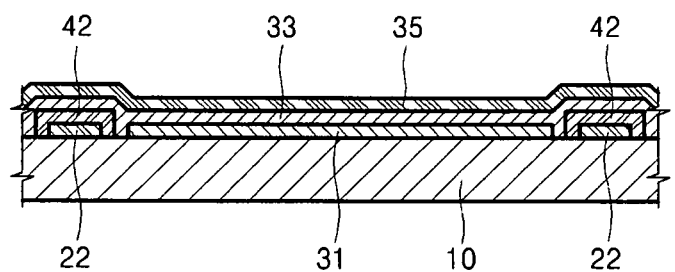
FIG. 5 is a cross-sectional view of the sign board of FIG. 4 taken along a line V-V of FIG. 4, board including an element that is not illustrated in FIG. 4, according to an embodiment of the present invention.

FIG. 4 is a plan view schematically illustrating a part of a sign board using an OLED, according to another embodiment of the present invention and FIG. 5 is a cross-sectional view of the sign board of FIG. 4 taken along a line V-V of FIG. 4, including an element that is not illustrated in FIG. 4, according to an embodiment of the present invention.

Referring to FIGS. 4 and 5, unlike the sign board illustrated in FIGS. 1 and 2, the sign board according to the current embodiment further includes a plurality of second conductive lines 22 which are disposed to cross the first conductive lines 21 and form a conductive grid along with the first conductive lines 21. In other words, the second conductive lines 22 connect the first conductive lines 21 to each other. In addition, the pixel electrodes 31 are disposed in regions defined by the first conductive lines 21 and the second conductive lines 22. The second conductive lines 22 may be formed of the materials used to form the first conductive lines 21, and the first conductive lines 21 and the second conductive lines 22 may be integrally formed as a single body, if necessary. In addition, as illustrated in FIG. 5, the sign board according to the current embodiment may further include an insulator 42 to cover a part of the first conductive lines 21 other than a part to which the pixel electrodes 31 are electrically connected, and the second conductive lines 22.

Since the sign board according to the current embodiment includes the second conductive lines 22, in addition to the first conductive lines 21, voltage drop occurring due to resistance of the first conductive lines 21 can be effectively prevented so that each pixel (sub-pixel) emits light having a uniform brightness throughout the entire surface of the sign board.

When the manufacture of the sign board realizing an image with a specific design is completed using the sign board according to the current embodiment, the sign board includes the plurality of the first pixel electrodes electrically connected with the first conductive lines 21 and the plurality of the second pixel electrodes that are not electrically connected with the first conductive lines 21 and further includes the plurality of the second conductive lines 22 for forming the conductive grid along with the first conductive lines 21. The pixel electrodes 31 are disposed in regions defined by the first conductive lines 21 and the second conductive lines 22. In this case, if necessary, the sign board according to the current embodiment may further include an insulator 42 to cover a part of the first conductive lines 21 other than a part to which the pixel electrodes 31 are electrically connected, and the second conductive lines 22.

According to the present invention, a high-quality sign board that can be easily adapted to various designs applied by users can be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A sign board including an organic light emitting device (OLED), the sign board comprising:
   a substrate;
   a plurality of first conductive lines disposed on the substrate, the plurality of the first conductive lines being electrically connected to each other;
   a plurality of pixel electrodes electrically conductively connected with the first conductive lines;
   an intermediate layer disposed on the pixel electrodes, the intermediate layer comprising a light emitting layer for emitting light, the intermediate layer covering a space between the pixel electrodes; and
   a face electrode disposed on the intermediate layer.

2. The sign board of claim 1, further comprising an insulator to cover a part of the first conductive lines other than a part to which the pixel electrodes are electrically connected.

3. The sign board of claim 1, further comprising a plurality of second conductive lines, each of which connects at least two of the first conductive lines to each other, one of the pixel electrodes being disposed between two of the first conductive lines and between two of the second conductive lines.

4. The sign board of claim 3, further comprising an insulator to cover a part of the first conductive lines other than a part to which the pixel electrodes are electrically connected, and the second conductive lines.

5. A sign board including an organic light emitting device (OLED), the sign board comprising:
   a substrate;
   a plurality of first conductive lines disposed on the substrate, the plurality of the first conductive lines being electrically connected to each other;
   a plurality of pixel electrodes comprising:
      a plurality of first pixel electrodes electrically connected with the first conductive lines; and
      a plurality of second pixel electrodes that are not electrically connected with the first conductive tines, the plurality of the second pixel electrodes being isolated so that no electrical signals are applied to the plurality of the second pixel electrodes;
   an intermediate layer disposed on the pixel electrodes, the intermediate layer comprising a light emitting layer for emitting light; and
   a face electrode disposed on the intermediate layer.

6. The sign board of claim 5, further comprising an insulator to cover a part of the first conductive lines other than a part to which the pixel electrodes are electrically connected.

7. The sign board of claim 5, further comprising a plurality of second conductive lines, each of which connects at least two of the first conductive lines to each other, one of the pixel electrodes being disposed between two of the first conductive lines and between two of the second conductive lines.

8. The sign board of claim 7, further comprising an insulator to cover a part of the first conductive lines other than a part, to which the pixel electrodes are electrically connected, and the second conductive lines.

* * * * *